United States Patent [19]
Urlaub et al.

[11] Patent Number: 5,926,233
[45] Date of Patent: Jul. 20, 1999

[54] RECEPTACLE

[75] Inventors: Günter Urlaub, Schaafheim-Schlierbach; Gerhard Wesner, Sulzbach; Gerhard Friepes, Bad Nauheim; Bernward Kneer, Karlstein, all of Germany

[73] Assignee: Vdo Adolf Schindling AG, Frankfurt, Germany

[21] Appl. No.: 08/838,167

[22] Filed: Apr. 16, 1997

[30] Foreign Application Priority Data

Apr. 19, 1996 [DE] Germany ............................ 196 15 458

[51] Int. Cl.[6] ............................ H05K 5/00; G02F 1/136; G02F 1/1333; G02F 1/1335
[52] U.S. Cl. ................................... 349/5; 349/42; 349/58; 349/70; 361/684; 361/683; 361/681
[58] Field of Search .................................... 349/5, 42, 58, 349/70, 60; 361/684, 683, 681, 682; 200/302.2, 339, 441, 445

[56] References Cited

U.S. PATENT DOCUMENTS 5,270,847  12/1993  Sano .......................................... 359/83
5,340,955  8/1994  Calvillo et al. ....................... 200/302.2

FOREIGN PATENT DOCUMENTS 3408176  9/1985  Germany .

OTHER PUBLICATIONS

Patent Abstracts of Japan vol. 095, No. 008, Sep. 29, 1995 & JP 07 134284 A (Sharp Corp), May 23, 1995.

*Primary Examiner*—Robert Kim
*Assistant Examiner*—Roy M. Punnoose
*Attorney, Agent, or Firm*—Martin A. Farber

[57] ABSTRACT

A receptacle has an inset and a housing for the fastening of an LCD screen. The screen has contact surfaces and consists, at least in part, of a plastic injection molding. Plastic springs which are formed by molding on the inset prestress the LCD screen against the housing, and thus fasten it in the receptacle. In this connection, a heat-sealing foil at the same time is prestressed against the contact surfaces of the LCD screen and against the contact surfaces of a plate.

4 Claims, 1 Drawing Sheet

RECEPTACLE

FIELD AND BACKGROUND OF THE INVENTION

The present invention relates to a receptacle having an inset and a housing to receive an LCD screen with contact surfaces, and having spring elements which are developed to press conductive elements against the contact surfaces and the LCD screen against the housing.

Such a receptacle is frequently used to receive and contact LCD screens. In this connection, grooves are developed in the inset of the receptacle in order to receive the spring elements. These spring elements are developed, for instance, as a rubber pad and press the conductive elements against the contact surfaces and the LCD screen against the housing. In this way, the LCD screen is, at the same time, fastened in the receptacle and connected to the conductive elements. If a light box for the illuminating of the LCD screen is located in the inset, the conductive elements are extended to the rear of the receptacle in order to simplify the mounting. Rubber pads are also provided there for contacting with contact surface of a connection socket. Such rubber pads contribute to an unnecessary increase in the cost of manufacture and assembly of the receptacle.

SUMMARY OF THE INVENTION

It is an object of the invention so to develop a receptacle of the aforementioned type that it can be produced and assembled as inexpensively as possible.

According to the invention, the receptacle consists, at least in part, of a plastic injection molding and spring elements, constructed as plastic springs, which are formed by a molding on the housing or on the inset.

By this feature, the spring elements are no longer inserted separately in the inset, as in the known receptacle, but form a single part with it already at the time of their manufacture. In this way, the LCD screen, when assembled together with the receptacle, is automatically clamped between the inset and the housing without prior mounting of the spring elements in the inset being necessary. The plastic springs can be formed by molding on the inset or on the housing. If the plastic springs are developed on the housing, the LCD screen is prestressed against the insert. The production of the housing or the inset from a plastic injection molding makes possible an inexpensive application of the plastic springs by molding them thereon in series manufacture.

The plastic springs can, for instance, be spring tongues which protrude from the housing or the inset. However, they have a particularly large spring path if the plastic springs, in accordance with an advantageous further development of the invention, have an S shape. The large spring path facilitates the mounting of the LCD screen in the receptacle and makes it possible to insert LCD screens of different thickness in the receptacle.

The LCD screen is pressed uniformly against the inset or the housing if, for a lateral region of the LCD screen, several plastic springs, which are connected to each other by an equalization beam are present. The equalization beam distributes the spring forces of the plastic springs over a lateral region of the LCD screen, and it furthermore makes a uniform stressing of the conductive elements against the contact surfaces possible.

The conductive elements could, for instance, be simple cables, the ends which are fastened in recesses in the plastic springs or to the equalization beam. The contacting of the contact surfaces of the LCD screen with the conductive elements however is particularly reliable if the conductive elements are conductive paths applied to a heat-sealing film. Such a heat-sealing film is pressed and heated on the contact surfaces for the simultaneous attachment and contacting. The prestressing of the conductive paths against the contact surfaces by the plastic springs serves for additional assurance of the contacting.

The invention permits of numerous embodiments.

BRIEF DESCRIPTION OF THE DRAWING

With the above and other objects and advantages in view, the present invention will become more clearly understood in connection with the detailed description of a preferred embodiment, considered with the accompanying drawing, of which.

DETAILED DESCRIPTION OF THE PREFERRED EMBODIMENT

Figure 1:
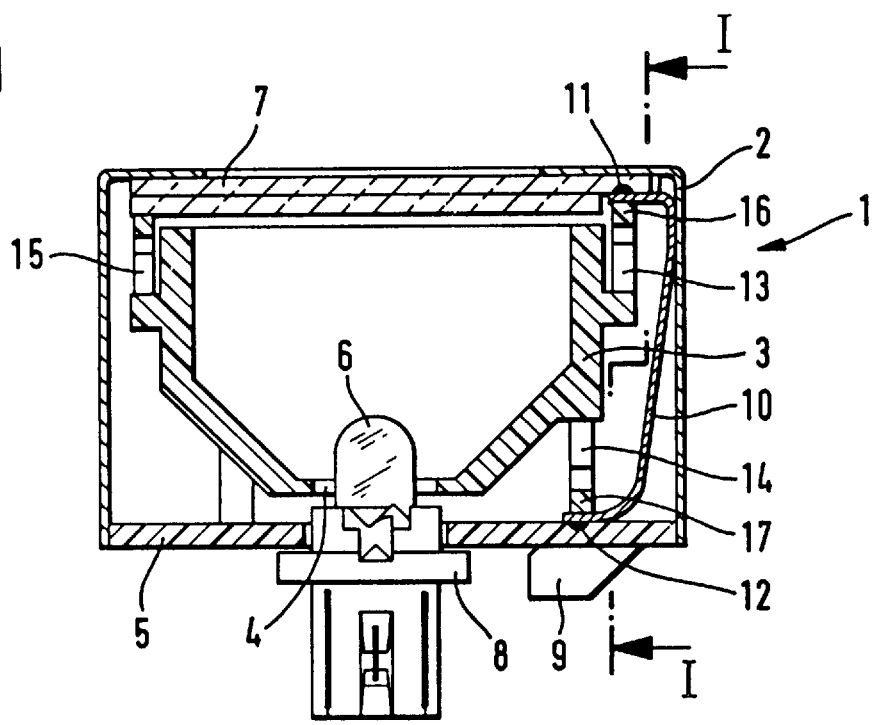
FIG. 1 is a sectional view through a receptacle in accordance with the invention.

FIG. 1 shows a receptacle 1, in accordance with the invention, having a housing 2 and an inset 3 developed as light box. The inset 3 has an opening 4 through which a lamp 6, arranged on a plate 5, extends. The lamp 6 serves thus for the backlighting of an LCD screen 7. The lamp 6 has a base 8. On the plate 5 there is arranged a connecting socket 9 via which the LCD screen 7 is supplied with electric current. The LCD screen 7 is connected by a heat-sealing foil 10 to the plate 5. For this purpose the plate 5 and the LCD screen 7 have contact surfaces 11, 12. By means of contact springs 13–15 which are molded on the inset 3, the heat-sealing foil 10 is clamped against the contact surface 11, 12, and the LCD screen 7 is clamped against the housing 2.

Figure 2:
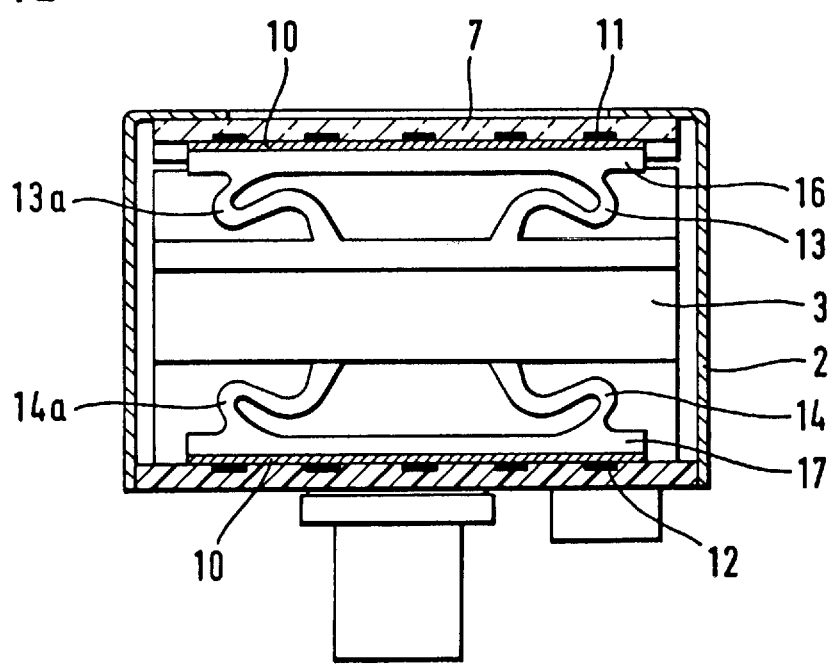
FIG. 2 is a sectional view through the receptacle of FIG. 1, along the line I—I.

The development of the contact springs 13, 14 can be noted particularly clearly from FIG. 2. FIG. 2 shows that the heat-sealing foil 10 is prestressed against the contact surfaces 11 of the LCD screen 7 and against the contact surfaces 12 of the connecting socket 9 by, in each case, two plastic springs 13, 13a, 14, 14a. Each of the plastic springs has an S shape. The plastic springs 13, 14 are connected in pairs with a equalizing beam 16, 17. The plastic springs 13–15, the inset 3, and the equalizing beams 16, 17 are developed as a unitary structural part of plastic injection molding.

We claim:

1. A receptacle having an inset, conductive elements, and a housing to receive an LCD screen, the LCD screen having contact surfaces, the LCD screen having spring elements which serve to press the conductive elements against the contact surfaces and to press the LCD screen against the housing;

wherein the receptacle is, at least partly, a plastic injection molding, and the spring elements are plastic springs which are part of a unitary molded structure with a supporting element, the supporting element being the housing or the inset.

2. A receptacle according to claim 1, wherein the plastic springs have an S shape.

3. A receptacle according to claim 1, further comprising:
   a lateral beam for contacting a lateral region of the LCD screen; and wherein a plurality of said plastic springs are connected to each other by the equalization beam.

4. A receptacle according to claim 1, further comprising:

a heat-sealing film enclosing as inner region of the housing and facing an inner surface of the housing; and wherein the conductive elements serve as conductive paths for the heat-sealing film.

* * * * *